(12) United States Patent
Hander et al.

(10) Patent No.: US 6,403,501 B1
(45) Date of Patent: Jun. 11, 2002

(54) METHOD OF CONTROLLING FSG DEPOSITION RATE IN AN HDP REACTOR

(75) Inventors: Jonathan W. Hander, Texas City, TX (US); Mahesh K. Sanganeria, Sunnyvale; Julian J. Hsieh, Pleasanton, both of CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/748,991

(22) Filed: Dec. 27, 2000

(51) Int. Cl.$^7$ .................. H01L 21/31; H01L 21/469
(52) U.S. Cl. .................. 438/783; 438/784; 438/788
(58) Field of Search ................. 438/783, 784, 438/788

(56) References Cited

U.S. PATENT DOCUMENTS 6,121,161 A * 9/2000 Rossman et al. ............ 438/783
6,200,911 B1 * 3/2001 Narwankar et al. ......... 438/758

\* cited by examiner

Primary Examiner—Alexander G. Ghyka
(74) Attorney, Agent, or Firm—Skjerven Morrill MacPherson LLP; Tom Chen

(57) ABSTRACT

A method is provided that conditions the chamber walls of a HDP CVD reactor by forming a layer of doped material prior to depositing dielectric layers of the doped material onto wafers. A consistent deposition rate can be maintained during subsequent deposition. When deposition is halted, the chamber is cleaned and a thin layer of the doped material is formed on the walls. Consequently, the chamber is kept at equilibrium even during periods of idle, thereby allowing the deposition rates to be consistent even after deposition resumes after the idle periods. For prolonged idle times, the chamber is re-cleaned and the doped material is re-deposited periodically, such as every 12 hours.

23 Claims, 3 Drawing Sheets

METHOD OF CONTROLLING FSG DEPOSITION RATE IN AN HDP REACTOR

BACKGROUND

1. Field of Invention

The present invention relates to semiconductor processing, and in particular, to chemical vapor deposition in a high density plasma reactor.

2. Related Art

High density plasma (HDP) chemical vapor deposition (CVD) processes are used in the fabrication of integrated circuits for depositing films on a substrate. One application of an HDP CVD process is to fill gaps on a semiconductor device having high aspect ratios (e.g., about 2.5:1 or greater) and close spacing (e.g., about 0.25 $\mu$m or less). Existing HDP CVD processes typically employ deposition with a process gas mixture that includes oxygen, silane, and inert gases, such as argon, to achieve simultaneous dielectric etching and deposition.

In an HDP process, RF bias is applied to a wafer substrate in a reaction chamber. As a result, the flux of deposition precursors is perpendicular to the wafer, and the net film growth occurs perpendicularly to the bottom of the feature. Some of the gas molecules (particularly argon) are ionized in the plasma and accelerate toward the wafer surface when the RF bias is applied to the substrate. Material is thereby sputtered when the ions strike the surface. As a result, dielectric material deposited on the wafer surface is simultaneously sputter-etched to help keep gaps open during the deposition process, which allows higher aspect ratio gaps to be filled.

An important goal in HDP deposition of these and other layers is to deposit a film of uniform thickness across the surface of a substrate and across different batches of substrates. One factor mitigating against uniform deposition is dopant concentrations in the processing environment. In HDP CVD processes, this is important because the reactor can act either as a sink or a source for dopants that affect the growth rate on the wafer.

A typical HDP CVD reactor includes a reaction chamber having an upper lid or dome, typically made of a ceramic such as aluminum oxide ($Al_2O_3$). During the deposition process, process gases are introduced into the chamber, and a plasma of the processing gases is generated within the chamber to effectuate chemical vapor deposition onto the substrate. However, the deposition typically occurs on all the surfaces exposed to the processing gases, including the interior surfaces of the chamber. If the dopant concentration of the processing environment is not in equilibrium, a shift in deposition rate can occur. This shift in deposition rate due to changing reactor conditions can be as high as 500 Å/min.

When the reactor is in an idle state, an argon and oxygen plasma, Known as an "idle plasma", is used maintain the reactor temperature. The oxygen in the idle plasma will deplete the fluorine species adsorbed to the sidewalls over time. This creates an environment that is not in equilibrium. For example, when depositing fluorine-doped silicon oxide layers, such as fluorosilicate glass (FSG), a reactor in an idle condition has been depleted of the dopants adsorbed to the chamber surfaces. When FSG deposition begins again, SiF species are adsorbed again to the reactor walls. This retards the deposition on the substrate surface. As the reactor approaches an equilibrium state, the deposition rate on the substrate rises and eventually levels off. Depending on the reactor conditions, the dopant concentration, and the target thickness of the FSG on the wafer, 200 or more deposition sequences may be required to reach a steady state. Once the reactor is in a steady state, processing must be continuous or the idle plasma will again begin to deplete the adsorbed dopants in the reactor causing the deposition rate on subsequent wafers to be reduced.

Accordingly, it is desirable to deposit a dielectric film without the problems discussed above that are associated with conventional techniques.

SUMMARY

In accordance with one aspect of the present invention, prior to beginning deposition of doped dielectric layers on wafers, a high density plasma (HDP) chemical vapor deposition (CVD) chamber is first conditioned by forming a layer of the doped material within the chamber walls. This conditioning quickly brings the chamber to an equilibrium state so that subsequent deposition of the doped dielectric material onto wafers yields consistent deposition rates because dopants are already adsorbed to the chamber walls. Approximately constant deposition rates can be maintained as long as the reactor is running and depositing layers onto wafers. However, if the deposition is halted for a certain amount of time, e.g., 20 minutes, and the reactor becomes idle, the chamber is plasma cleaned and a thin layer of the doped material is deposited onto the chamber walls. Periodically, for example, every 12 hours, the chamber is plasma cleaned and the thin layer is re-deposited. This allows consistent deposition rates even when the reactor has been idle for prolonged periods of time.

In one embodiment, initial conditioning, such as after a wet clean, is carried out by introducing a gas containing silicon fluoride ($SiF_4$), argon, and oxygen into the chamber to form a fluorosilicate glass (FSG) approximately 10 to 30 $\mu$m thick. After idle (e.g., 20 minutes without processing), the chamber is plasma cleaned and a thin FSG layer of approximately 1 to 3 $\mu$m is deposited. The plasma clean and deposition of the thin FSG layer is repeated periodically, e.g. every 12 hours, to maintain the chamber in an equilibrium state.

The present invention will be more fully understood when taken in light of the following detailed description taken together with the accompanying drawings.

BRIEF DESCRIPTION OF THE DRAWINGS

Use of the same or similar reference numbers in different figures indicates same or like elements.

DETAILED DESCRIPTION OF THE PREFERRED EMBODIMENTS

In accordance with one embodiment of the present invention, a gas mixture comprising of a silicon fluoride, such as $SiF_4$, is introduced into a high density plasma (HDP) chemical vapor deposition (CVD) reaction chamber to initially condition the reactor and then to maintain SiF equilibrium of the chamber walls. This helps to minimize variations in the deposition rate of subsequently deposited films, such as fluorosilicate glass (FSG). When the module is not in an equilibrium state (e.g., the chamber has been wet cleaned), a gas mixture comprising of a silicon fluoride, oxygen, and argon is introduced into the chamber to condition the reactor by forming a seasoning layer (e.g., 10 to 30 $\mu$m thick) on the chamber walls. This conditioning quickly brings the module to an equilibrium state. In another embodiment, when the HDP CVD chamber becomes idle (e.g., there has not been processing for at least 20 minutes), a gas mixture comprising of a silicon fluoride, oxygen, and argon is introduced into the chamber to form a thin layer (e.g., 1 to 3 $\mu$m) of FSG. This coating allows the deposition rate to remain approximately constant. The coating is plasma cleaned periodically (e.g., every 12 hours) and re-deposited to maintain the dopant equilibrium and deposition rate on subsequent wafers.

In one embodiment, the reactor, which begins at ground state after a wet clean, is brought to a steady state by chamber conditioning. A gas mixture comprising of a silicon fluoride gas, such as $SiF_4$, is introduced into an HDP CVD reaction chamber to form a seasoning coat on the walls of the chamber. Table 1 below provides values and ranges of values for various process parameters according to one embodiment.

TABLE 1

| Parameter | Value | Range |
|---|---|---|
| Ar flow | 125 sccm | 0–500 sccm |
| He flow | 0 sccm | 0–500 sccm |
| $O_2$ flow | 200 sccm | 50–300 sccm |
| $SiF_4$ flow | 120 sccm | 50–150 sccm |
| Dep. Rate | 4.5 kÅ/min. | 3–6 kÅ/min. |
| LF RF Power | 4 kW | 2–5 kW |

The thickness of the seasoning layer is between approximately 10 and 30 $\mu$m depending on the target dopant concentration of the deposition recipe. Conventional HDP processing then proceeds, such as deposition of an FSG film using HDP CVD. The seasoning layer allows the deposition rate of the subsequently deposited films to be fairly constant when compared to films deposited in HDP CVD reactors without the seasoning layer.

Figure 1:
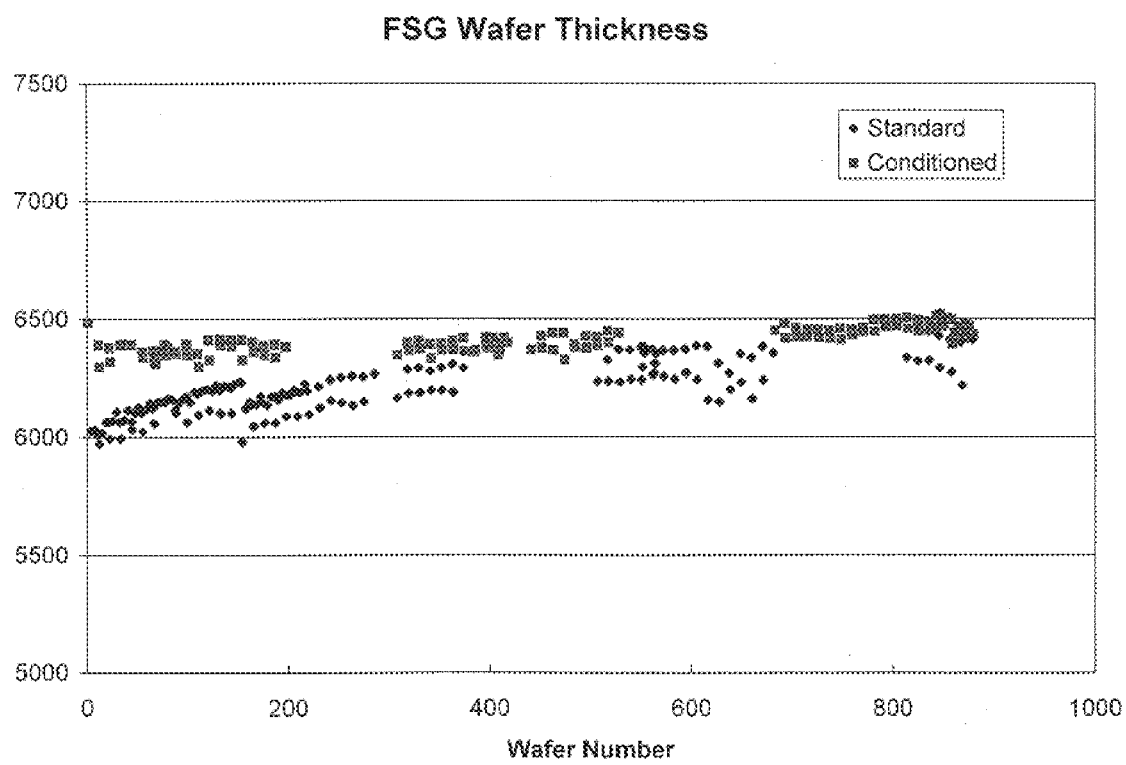
FIG. 1 is a plot comparing the thicknesses of deposited FSG layers for a standard chamber and for a chamber conditioned according to one embodiment of the present invention.

FIG. 1 shows a comparison of the thickness of the deposited layer (i.e., deposition rate) as a function of the number of wafers processed in the HDP CVD reactor. In FIG. 1, diamonds indicate films produced using the standard non-conditioned chamber. As seen, the thickness of the deposited film increases as the number of wafers processed increases, which is the expected result with increasing deposition rates. The deposition rate levels off as more wafers are processed because the reactor is approaching dopant equilibrium. In contrast, with films produced using a seasoning layer or a conditioned chamber (as indicated by squares), the thickness of the deposited films remains fairly constant, i.e., a constant deposition rate.

Once the reactor is in equilibrium, processing can proceed and the deposition rate will remain stable.

Figure 2:
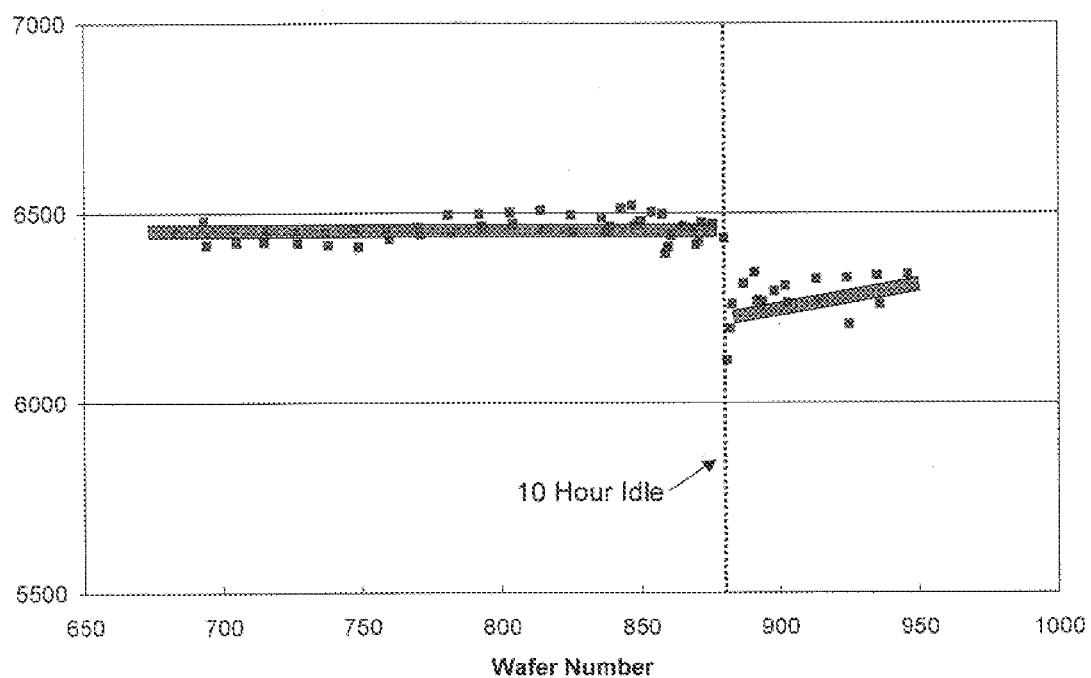
FIG. 2 is a plot showing the thickness of deposited FSG layers as a function of the number of wafers processed, before and after the chamber has been idle.

However, if wafer processing is halted and re-started, e.g., after 60 minutes, the deposition rate drifts back down. FIG. 2 shows that the thickness of the deposited layers decreases by approximately 250 Å after the chamber has been idle for 10 hours, i.e., a decreased deposition rate when processing starts again. The decrease in deposition rate is proportional to time, up to the point where the reactor reaches a ground state (i.e., fully depleted of dopants).

To maintain a fairly constant deposition rate (or wafer to wafer FSG thickness) regardless of idle time, a thin layer comprising of fluorinated silicon oxide is formed on the HDP CVD chamber walls during idle. This coating is triggered by software when the module has been idle for a user-defined time e.g., after 20 minutes. At this time, the module will be plasma cleaned and then the coating will be deposited. Table 2 below provides values and ranges of values for various process parameters according to one embodiment.

TABLE 2

| Parameter | Value | Range |
|---|---|---|
| Ar flow | 125 sccm | 0–500 sccm |
| He flow | 0 sccm | 0–500 sccm |
| $O_2$ flow | 200 sccm | 50–300 sccm |
| $SiF_4$ flow | 100 sccm | 50–150 sccm |
| $SiH_4$ flow | 0 sccm | 0–50 sccm |
| Dep. Rate | 4 kÅ/min. | 3–6 kÅ/min. |
| LF RF Power | 4 kW | 2–5 kW |

Figure 3:
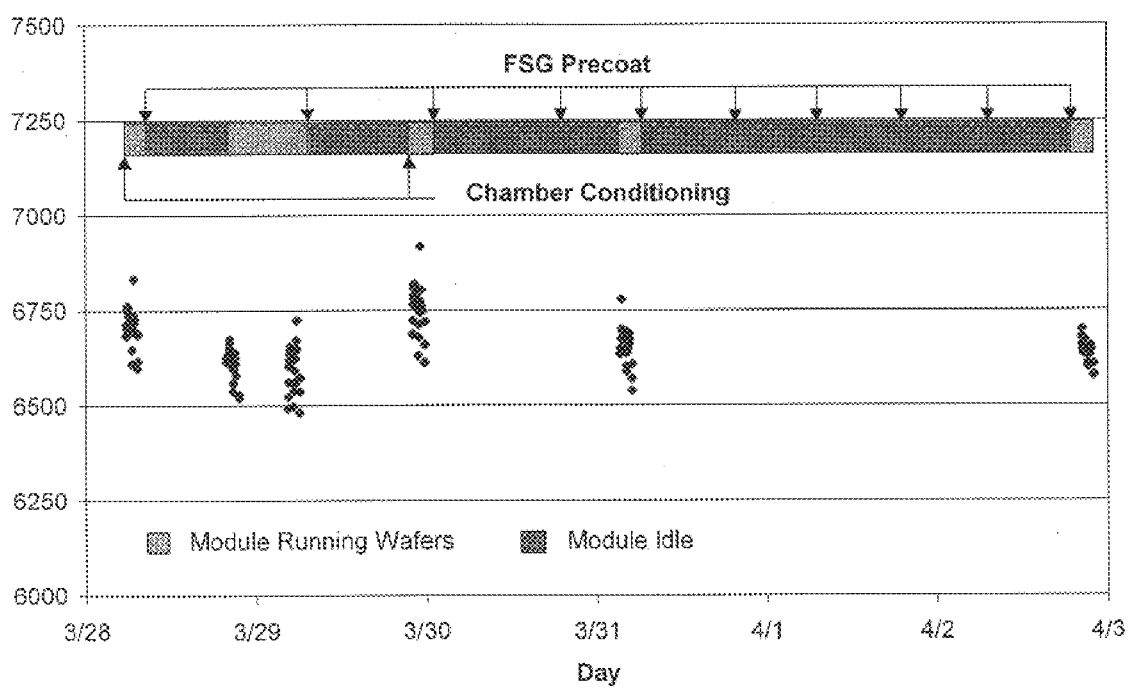
FIG. 3 is a plot showing the thickness of deposited FSG layers using chamber conditioning and FSG precoat according to another embodiment of the present invention.

The thickness of the FSG layer is between approximately 1 and 3 $\mu$m. The FSG coating allows the deposition rate, when processing resumes after an idle period, to remain fairly constant. FIG. 3 shows the thickness of the FSG layer deposited on the wafers as a function of time. As seen from FIG. 3, the thickness of the FSG layer is fairly constant (between approximately 6500 Å and 6800 Å), even when the chamber has been idle for over two and a half days. To maintain a constant deposition rate, the HDP CVD chamber is cleaned and re-coated with the FSC- layer periodically, e.g., every 12 hours. Note that more frequent re-coating reduces the variations of deposition rate between wafers.

The above-described embodiments of the present invention are merely meant to be illustrative and not limiting. It will thus be obvious to those skilled in the art that various changes and modifications may be made without departing from this invention in its broader aspects. For example, description illustrates the use of fluorine doped silicon oxide as the deposited layer. However, the method of the present invention can also be used with other deposited layers in the production of integrated circuits. Therefore, the appended claims encompass all such changes and modifications as fall within the true spirit and scope of this invention.

What is claimed is:

1. A method of forming doped dielectric layers on wafers in a high density plasma chemical vapor deposition reactor, the method comprising:

initially cleaning the walls of said reactor;

forming a seasoning layer of doped material on the walls of said reactor prior to forming said doped dielectric layers, wherein the doped material is comprised of the same dopant as the doped dielectric layers; and depositing said doped dielectric layers on said wafers.

2. The method of claim 1, wherein said seasoning layer is approximately 10 to 30 $\mu$m thick.

3. The method of claim 1, wherein said doped material is a fluorosilicate glass.

4. The method of claim 1, wherein said initial cleaning comprises performing a wet clean.

5. The method of claim 1, wherein forming said seasoning layer comprises introducing a gas mixture comprising oxygen, argon, and silicon fluoride.

6. The method of claim 1, further comprising:

after the reactor has been idle for a first period of time, cleaning the walls of said reactor; and forming a thin layer of doped material on the walls of said reactor prior to restarting the reactor, wherein the doped material is comprised of the same dopant as the doped dielectric layers.

7. The method of claim 6, wherein said first period is between approximately 20 and 60 minutes.

8. The method of claim 6, wherein said cleaning comprises performing a plasma clean.

9. The method of claim 6, wherein said seasoning and thin layers are fluorosilicate glass layers.

10. The method of claim 6, wherein said thin layer is approximately 1 to 3 $\mu$m thick.

11. The method of claim 6, wherein forming said thin layer comprises introducing a gas mixture comprising oxygen, argon, and silicon fluoride.

12. The method of claim 6, further comprising repeating said cleaning and said forming the thin layer after the reactor has been idle for a second period of time.

13. The method of claim 12, wherein said second period of time is longer than said first period of time.

14. The method of claim 13, wherein said second period of time is approximately 12 hours or greater.

15. A method of semiconductor device processing in a high density plasma chemical vapor deposition reactor, comprising:

running said reactor for deposition of doped dielectric layers on a plurality of wafers;

cleaning the walls of said reactor after said deposition has been halted for a first period of time;

forming a thin layer of doped silicon oxide on the walls of said reactor, wherein said thin layer comprises the same dopant as said doped dielectric layers; and re-starting said reactor to resume deposition of said doped dielectric layers on the wafers.

16. The method of claim 15, wherein said first period of time is greater than approximately 20 minutes.

17. The method of claim 15, wherein said cleaning comprises performing a plasma clean.

18. The method of claim 15, wherein said dopant is fluorine.

19. The method of claim 15, wherein said thin layer and said dielectric layers are fluorosilicate glass layers.

20. The method of claim 15, wherein said thin layer is approximately 1 to 3 $\mu$m thick.

21. The method of claim 15, further comprising:

after said forming, re-cleaning said walls and re-forming said thin layer periodically when said reactor is idle.

22. The method of claim 21, wherein said re-cleaning and re-forming is performed at time intervals greater than said first period of time.

23. The method of claim 22, wherein said time interval is approximately 12 hours or greater.

* * * * *